United States Patent
Wang et al.

(10) Patent No.: US 6,696,372 B2
(45) Date of Patent: Feb. 24, 2004

(54) METHOD OF FABRICATING A SEMICONDUCTOR STRUCTURE HAVING QUANTUM WIRES AND A SEMICONDUCTOR DEVICE INCLUDING SUCH STRUCTURE

(75) Inventors: Benzhong Wang, El Monte, CA (US); Soo Jin Chua, Singapore (SG)

(73) Assignee: Agency for Science, Technology and Research, Centros (SI)

(*) Notice: Subject to any disclaimer, the term of this patent is extended or adjusted under 35 U.S.C. 154(b) by 90 days.

(21) Appl. No.: 10/014,257

(22) Filed: Dec. 7, 2001

(65) Prior Publication Data

US 2002/0119680 A1 Aug. 29, 2002

(30) Foreign Application Priority Data

Dec. 8, 2000 (SG) ......................... 200007724

(51) Int. Cl.$^7$ ............................................. H01L 21/00
(52) U.S. Cl. ..................... 438/962; 438/47; 438/503; 257/15; 257/14; 257/22
(58) Field of Search ............... 438/962, 47, 172, 438/503, 507, 149, 22, 46, 151, 161, 300; 257/255, 14, 15, 22, 201, 627, 628, 9, 11, 12, 213; 372/45

(56) References Cited

U.S. PATENT DOCUMENTS

| | | | | |
|---|---|---|---|---|
| 4,591,889 A | * | 5/1986 | Gossard et al. ............... 257/15 |
| 4,931,132 A | * | 6/1990 | Aspnes et al. ............... 117/86 |
| 4,952,792 A | * | 8/1990 | Caridi ............... 257/18 |
| 4,987,094 A | * | 1/1991 | Colas et al. ............... 257/185 |
| 5,013,683 A | * | 5/1991 | Petroff et al. ............... 117/86 |
| 5,202,290 A | * | 4/1993 | Moskovits ............... 438/478 |
| 5,298,108 A | * | 3/1994 | Miller ............... 148/33.4 |
| 5,523,585 A | * | 6/1996 | Nakamura ............... 257/20 |
| 5,614,435 A | * | 3/1997 | Petroff et al. ............... 117/85 |

(List continued on next page.)

OTHER PUBLICATIONS

Yoshida et al, "Effect of GaP(m)/InP(m) Short Period Binary Supperlattice Period on Quantum Wire Formation by Strain Induced Laterial Layer Ordering in GaInP/AlInP Multi–Quantum–Wire lasers" Sophia University WA1.5 pp. 29–32.*

(List continued on next page.)

*Primary Examiner*—Carl Whitehead, Jr.
*Assistant Examiner*—Laura M Schillinger
(74) *Attorney, Agent, or Firm*—Ladas & Parry (57) ABSTRACT

A method for the production of a semiconductor structure having self-organized quantum wires is described. The process includes the formation of multi-atomic steps on a (001) oriented semiconductor substrate inclined at an angle toward the [110] direction. Quantum wires are then spontaneously formed in situ along edges of the multi-atomic steps during epitaxial growth of a semiconductor with a larger or smaller lattice constant than the substrate but with a band gap narrower than that of the underlying material. Further deposition of a layer of semiconductor with a lattice constant within 1% of the substrate but with a band gap wider than that of the wire material then buries the quantum wires between this layer and the substrate layers. These layers are free of defects. Crystal and energy level structures of the quantum wire such as linear density, lateral and vertical dimension, and emission wavelength of photoluminescence can be easily controlled by selecting the angle of inclination of the substrate, lattice mismatch and different combinations of materials. A semiconductor laser with the active layer comprising quantum wires made by this method is also disclosed.

28 Claims, 5 Drawing Sheets

U.S. PATENT DOCUMENTS

| | | | | |
|---|---|---|---|---|
| 5,663,592 A | * | 9/1997 | Miyazawa et al. | 257/627 |
| 5,746,826 A | * | 5/1998 | Hasegawa et al. | 117/90 |
| 5,818,073 A | * | 10/1998 | Ochi et al. | 257/85 |
| 5,882,952 A | * | 3/1999 | Kizuki et al. | 438/47 |
| 5,886,360 A | * | 3/1999 | Ochi | 257/15 |
| 5,907,161 A | * | 5/1999 | Ochi et al. | 257/94 |
| 6,103,600 A | * | 8/2000 | Ueda et al. | 438/503 |
| 6,551,929 B1 | * | 4/2003 | Kori et al. | 438/685 |
| 2002/0119680 A1 | * | 8/2002 | Wang et al. | 438/962 |

OTHER PUBLICATIONS

Bressler–Hill et al, "Island Scaling in Strained Heteroepitaxiay: InAs/GaAs (001)", Physical Review Letters, vol.74, No. 16, 3209–3212, Apr. 17, 1995.*

Lin et al "Self–Assembled GaAs Antiwires in In (0.53)Ga(0.47)As matrix on (100) InP substrates", Applied Physics Letters, vol. 81, No. 16, 3007–3009, Oct. 14, 2002.*

Petroff et al, "Epitaxially Self–Assembled Quantum Dots", 1–6, Http://fkpme246a.uni–duisburg.de/ag_lorke/people/lorke/publications/physics_today/p46.html.*

Yamauchi et al, "Theoretical Analysis of Band Structures and Lasing Characteristics in Strained Quantum Wire Lasers", IEEE Journal of Quantum Electronics, vol.29, No.6, 2109–2115, Jun. 1993.*

Zhang et al, "Effects of strain, substrate misorientation, and excitonic transition on the optical polarization of ordered zinc–blende semiconductor alloys", J. Appl. Phys. 81 (9), 6365–6373, May 1, 1997.*

Vurgaftman et al, "A comparison of optoelectronic properties of lattice–matched and strained quantum–well and quantu–wire structures", IEEE Journal of Quantum Electronics, vol.30 No.1 75–83, Jan. 1994.*

Passlack et al, "Insulator Passivation of In (0.2)Ga (0.8)As–GaAs Surface Quantum Wells", IEEE Journal of Quantum Electronics, vol.34, No.2, 307–309, Feb. 1998.*

* cited by examiner

METHOD OF FABRICATING A SEMICONDUCTOR STRUCTURE HAVING QUANTUM WIRES AND A SEMICONDUCTOR DEVICE INCLUDING SUCH STRUCTURE

FIELD OF THE INVENTION

THIS INVENTION relates to the fabrication of a semiconductor structure having quantum wires and, in particular, to a method of fabricating a semiconductor structure having self-organised quantum wires and to a device including such a structure.

It is known that semiconductor devices incorporating quantum structures, such as quantum wires or quantum dots, exhibit enhanced quantum size effects which result in excellent electrical and optical characteristics in comparison with semiconductor devices which have no such quantum structures. For example, when such quantum structures are employed in a laser diode, this may provide advantages such as a low threshold current, a high differential gain, a large modulation bandwidth, a high characteristic temperature and a large non-linear gain.

However, in order to fabricate high quality quantum wires or quantum dots, charge carriers in an active layer must be confined not only in one dimension but in each of two dimensions (in the case of quantum wires) or in each of three dimensions (in the case of quantum dots) by corresponding perfect crystalline interfaces.

There are already a number of known methods for the formation of semiconductor structures having quantum wires.

In one known method, a quantum well is first grown on a semiconductor substrate and lines are lithographically etched in the substrate at intervals of tens of nanometers (nm) using an electron beam or X-rays to define a pattern of wires or dots. The semiconductor is then epitaxially re-grown, using a material with a larger bandgap than the quantum well material, thereby embedding and confining the wires or dots in the larger bandgap material. Quantum wires formed in this manner, however, have many surface irregularities and these greatly reduce the quantum efficiency of the structure.

In another known method, the quantum wires are formed during the growth of an epitaxial layer, for example, by selective growth of an epitaxial layer [Appl. Phys. Lett. 71, 2005 (1997)], by the growth of an epitaxial layer on a micro-patterned substrate [U.S. Pat. No. 5,827,754] or by the growth of an epitaxial layer on a vicinal substrate. For example, U.S. Pat. No. 5,882,952 discloses the fabrication of quantum wires by forming multi-atomic step edges on a (110) surface of a gallium arsenide (GaAs) substrate inclined at an angle toward the [00-1] or the [1-1-1] direction and then growing a gallium arsenide/aluminium gallium arsenide (Ga.As/AlGaAs) double heterostructure on the GaAs substrate to form quantum wires on the steps of the vicinal substrate. U.S. Pat. No. 4,591,889 discloses the formation of quantum wires by growing a submonolayer superlattice on a vicinal substrate parallel to the substrate surface.

Another method of fabricating quantum wires during the growth of an epitaxial layer is by using a horizontal superlattice created by a strain-induced lateral-layer ordering process in molecular beam epitaxy (MBE) [Appl. Phys. Lett. 60, 2892 (1992)] using compounds AC and BC. Here it is confirmed that the growth of an (AC)m/(BC)n short-period superlattice on a substrate, where m and n are the numbers of monolayers and the lattice constants of AC and BC are respectively larger and smaller than that of the substrate, forms a periodic modulation of A-rich and B-rich regions in compound $A_xB_{1-x}$ C parallel to the substrate surface which thereby provides lateral confinement of carriers.

The optical and electronic properties of small dimensional semiconductor structures have been improved greatly by the introduction of strain effects. The Stranski-Krastanow (SK) growth mode has been the most important technique in forming quantum dots having unique opto-electronic properties [Phys. Rev. Lett. 73,716 (1994)]. It has been demonstrated that highly strained heteroepitaxial growth generally proceeds by the formation of islands, which can served as quantum dots, after an initial layer-by-layer growth using molecular beam epitaxy (MBE) or metal organic chemical vapour deposition (MOCVD) technology. Studies of these islands by scanning tunnelling microscope (STM) and transmission electron microscope (TEM) have demonstrated that at the initial stage of formation, the islands are dislocation-free and coherently strained to the substrate.

SUMMARY OF THE INVENTION

It is an object of the present invention to provide a method of fabricating a semiconductor structure comprising quantum wires which have effective lateral confinement of carriers and exhibit enhanced strain effects and to provide a semiconductor device incorporating such quantum wires.

Accordingly, in one aspect, the present invention provides a method of fabricating a semiconductor structure having self-organised quantum wires, comprising:

a) providing a substrate of a first semiconductor having single atomic steps on a vicinal surface thereof;

b) epitaxially depositing a second semiconductor on the vicinal surface of the substrate, so that the surface of the second semiconductor presents multi-atomic steps;

c) epitaxially depositing on the second semiconductor a third semiconductor which has a larger lattice mismatch than the second semiconductor with the first semiconductor and which has a narrower band gap than the second semiconductor to form quantum wires of the third semiconductor along the edges of the multi-atomic steps of the second semiconductor; and d) epitaxially depositing on the third semiconductor a fourth semiconductor with a band gap wider than the third semiconductor to bury the quantum wires in the second and fourth semiconductors.

The quantum wires of the third semiconductor are formed spontaneously along the edges of the multi-atomic steps of the second semiconductor after a two-dimensional layer growth of the third semiconductor, the quantum wires having a linear density and a lateral dimension determined by the angle of the vicinal surface and the lattice mismatch between the second and third semiconductors. The layers of the second and fourth semiconductors provide sharp lateral potential steps confining the carriers in each quantum wire.

The result is a semiconductor structure which is reliably formed with uniform quantum wires of predetermined size and density and with enhanced strain effect.

Preferably, the vicinal surface of the substrate is a nominal (001) surface inclined at an angle to the [110] direction and is inclined at an angle of less than ten degrees to the [110] direction.

The second semiconductor is selected to have a lattice mismatch of less than 1.0% with the first semiconductor and, in an embodiment of the invention, the second semiconductor is the same as the first semiconductor.

The fourth semiconductor is chosen to have a lattice mismatch of less than 1.0% with the first semiconductor and, in an embodiment of the invention, the fourth semiconductor is the same as the first semiconductor.

The third semiconductor is selected to have a lattice mismatch of at least 2.5% with the first semiconductor.

The first semiconductor may be any suitable semiconductor, such as GaAs or InP; the second and fourth semiconductors may be selected from the group consisting of compound semiconductors formed from group III and group V elements and compound semiconductors formed from group II and group VI elements; and the third semiconductor may be selected from the group consisting of binary and ternary compound semiconductors formed from group III and group V elements and binary and ternary compound semiconductors formed from group II and group VI elements.

By selecting the semiconductors appropriately, different optical and electronic properties, such as the wavelength of photoluminescence (PL) emission from the quantum wires, can be obtained.

The second, third and fourth semiconductors may be deposited by an epitaxial growth performed by an epitaxial growth technique selected from the group consisting of MOCVD, gas source molecular beam epitaxy (GSMBE), vapour phase epitaxy (VPE), chemical beam epitaxy (CBE) and MBE. In embodiments of the invention, the deposition of the second third and fourth semiconductors is performed by MOCVD.

The second and fourth semiconductors are deposited with a maximum thickness which does not exceed a critical thickness at which dislocations are generated.

The deposition conditions of the third semiconductor on the second semiconductor may be determined by observation of the surface texture using microscopy having resolution on the nanometer scale after the deposition of the third semiconductor. The deposition rate of the third semiconductor should be no more than 2 angstroms (Å) per second (s) and is preferably of the order of 0.1 to 1 Å/s. The third semiconductor may be deposited at a temperature in the range of 380 to 580° C., depending on the first semiconductor used. In the case where the first semiconductor is GaAs the deposition temperature of the third semiconductor is preferably in the range of 400 to 550° C. The third semiconductor is grown to a thickness of from 0.3 to 3.0 nanometers (nm), such that quantum wires are formed. The thickness of the third semiconductor should not be any thicker, since this may result in the formation of islands and/or dislocations.

A semiconductor structure embodying the invention may be provided with a plurality of layers of quantum wires by repeating steps c) and d) a desired number of times to form a plurality of layers of quantum wires, the thickness of the fourth semiconductor deposited at each stage preferably being no more than 50 nm.

An epilayer with a lattice constant larger than the layer on which it is grown is said to have a positive lattice mismatch. On the other hand, if the lattice constant is smaller than the layer on which it is grown, it is said to have a negative lattice mismatch.

In one embodiment of the invention, the third semiconductor deposited on the second semiconductor has a lattice constant greater than that of the second semiconductor, this positive lattice mismatch placing the third semiconductor under compression. In particular, if the first semiconductor is GaAs, the third semiconductor may, for example, be $InAs_xSb_{1-x}$ ($0 \leq x \leq 1$) and the second and fourth semiconductors may be $In_xGa_{1-x}As$ ($0 \leq x \leq 0.2$), (thereby forming $InAs_xSb_{1-x}$ ($0 \leq x \leq 1$) self-organised quantum wires.

In another embodiment, the third semiconductor material deposited on the second semiconductor has a lattice spacing smaller than the second semiconductor, this negative lattice mismatch placing the third semiconductor under tension. In particular, if the first semiconductor is InP, the second and fourth semiconductors may both be InAlAs, which is lattice matched to InP, and the third semiconductor deposited on the second semiconductor may be GaAs, the band gap of which is narrower than that of InAlAs, thereby forming GaAs self-organised quantum wires.

A method embodying the invention thus enables semiconductor structures containing self-organised quantum wires having unique optical and electronic properties to be reliably and controllably fabricated.

In another aspect, the invention accordingly provides a semiconductor device comprising: a substrate of a first semiconductor having single atomic steps on a vicinal surface thereof; a layer of a second semiconductor deposited on the vicinal surface of the substrate and having multi-atomic steps on the surface thereof; a layer of a third semiconductor deposited on the second semiconductor, the third semiconductor having a greater lattice mismatch than the second semiconductor with the first semiconductor and having a narrower band gap than the second semiconductor, the layer of the third semiconductor forming quantum wires along the edges of the multi-atomic steps of the second semiconductor; and a layer of a fourth semiconductor deposited on the third semiconductor, the fourth semiconductor having a wider band gap than the third semiconductor and the quantum wires being buried in the second and fourth semiconductors.

A semiconductor structure embodying the present invention finds particular application as an edge-emitting semiconductor laser.

BRIEF DESCRIPTION OF THE DRAWINGS

In order that the invention may be more readily understood, embodiments thereof will now be described, by way of example only, with reference to the accompanying drawings, in which.

DETAILED DESCRIPTION OF THE EMBODIMENTS

A method embodying the present invention for producing self-organised quantum wires results in the formation of wire structures in situ during epitaxy of a highly strained material which is grown on a vicinal substrate prepared to present multi-atomic steps and which exhibits a positive lattice mismatch. The preferred nucleation sites of the wires are on the edges of the multi-atomic steps. Further deposition of a capping layer of material having a larger band gap than the wire material then produces single layer quantum wires enclosed by the underlying layer and the capping layer. These layers are free of defects.

Strained epitaxial layers are known to undergo a phase transition during deposition which is observed as a transformation of the two-dimensional epitaxial surface into three-dimensional island structures. The islands are dislocation-free when initially formed. However, before the formation of the island structures, wire structures can be formed along the edges of the multi-atomic steps during the initial stages of the transformation of the epitaxial growth from the two-dimensional to the three-dimensional growth mode by adopting appropriate growth conditions. If more materials are deposited at higher temperatures (450–550° C.), island structures are formed. However, at a lower growth temperature, for example 410° C., the surface morphology of wire structures is still maintained when the nominal thickness of the deposited material is 6 monolayers. This observed property is exploited in a method embodying the present invention to provide a fabrication process for quantum wires. By interrupting the growth of the strained layer at or just after the thickness for the wire formation, extremely small and quite uniform wires, with a lateral dimension usually less than 200 Å, are formed on the deposited material. The wires are buried by deposition of another material in a subsequent step to create a layer of quantum wires free of dislocations.

A two-dimensional band gap modulation is then directly built into the structure to produce useful quantum wires. A method embodying the invention requires no processing steps before or after growth of the quantum wires and, therefore, creates quantum wires with good quality on MOCVD grown interfaces. In addition, the quantum wires fabricated in accordance with a method embodying the present invention have a much enhanced two-dimensional, vertical and lateral, confinement of carriers as well as exhibiting greater strain effects on carriers in the wires than is the case with wires formed by other methods.

Figure 1A:
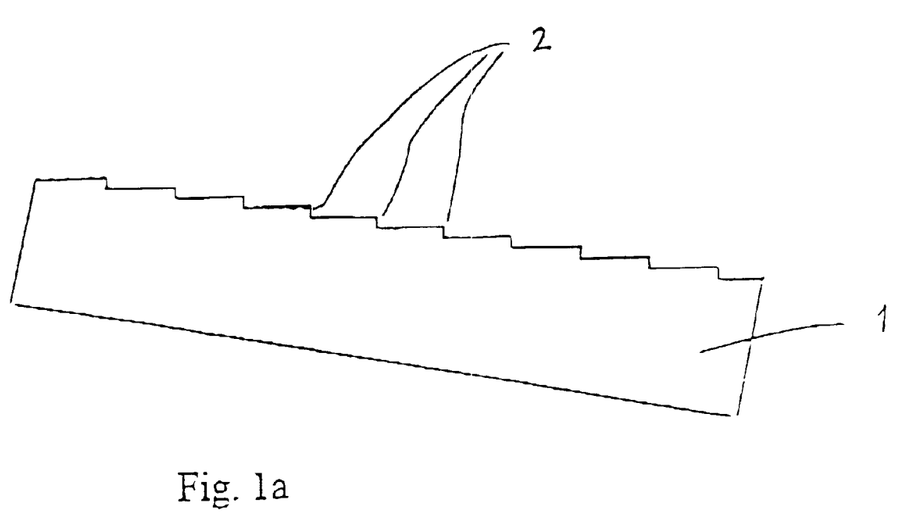
FIGS. 1a–1c are cross-sectioned views illustrating, on an enlarged scale, the steps of a method embodying the invention for fabricating an indium arsenide (InAs) quantum wire structure on an (001) vicinal GaAs substrate.
Figure 1B:
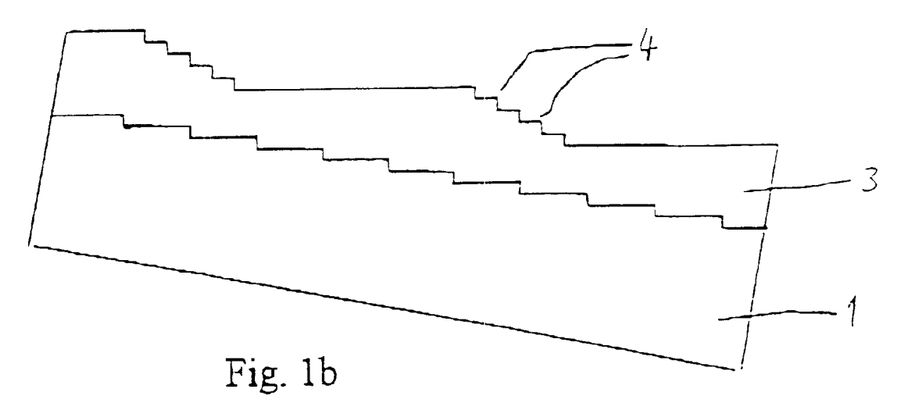
Figure 1C:
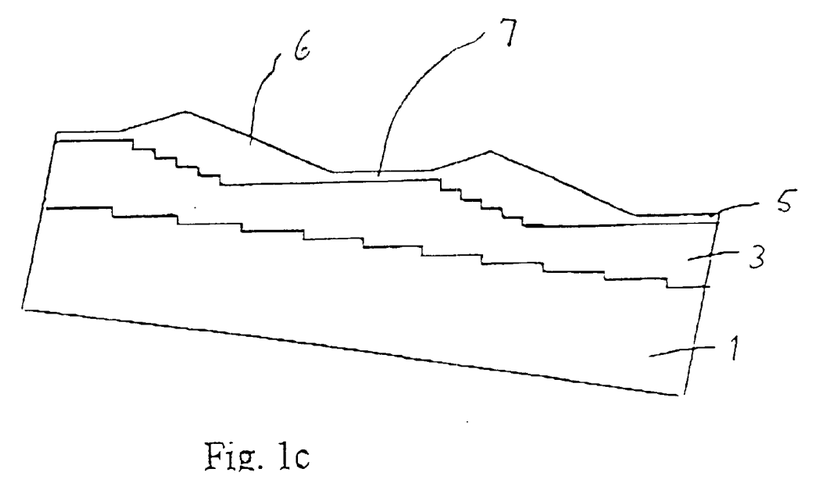

FIGS. 1a to 1c illustrate successive stages in the formation of a semiconductor structure having quantum wires by a method embodying the invention. As shown in FIG. 1a, the method starts from a substrate 1 of a first semiconductor, GaAs in this case, having a vicinal (001) surface which is inclined at 2 degrees to the [110] direction and which has thereon single atomic steps 2 along the [-110] direction with a density of about 110 steps per micron.

Referring now to FIG. 1b, a layer 3 of a second semiconductor, in this case also GaAs, is epitaxially grown on the GaAs substrate 1 to a thickness of about 0.1 micron using MOCVD technology at a growth temperature of 650° C. and at a reactor pressure of 100 mbar. TBA and trimethylgallium (TMGA) served as source materials and Pd-purified $H_2$ is used as the carrier gas during the growth. The growth rate of the GaAs is 4 Å/s and the molar flow ratio of the group V and group III sources is 20. As shown in FIG. 1b, multi-atomic steps 4 are formed on the surface of the GaAs layer 3 at a density of about 18 per micron.

A layer 5 of a third semiconductor, in this case InAs, with a nominal thickness of about 2 monolayers (as showing in FIG. 1c) is then epitaxially grown on the surface of the GaAs layer 3 using TBA and trimethyindium (TMIn) as source materials at growth temperature of about 450° C. A growth rate of 0.56 Å/s and a molar flow ratio of group V and group III sources of 40 are used in the InAs growth. InAs quantum wires 6 then spontaneously form along the edges of the multi-atomic steps 4 (FIG. 1b) of the GaAs semiconductor layer 3 after the two-dimensional layer 7 of InAs is formed, as shown in FIG. 1c.

The growth conditions for the formation of quantum wires are determined by observation of the surface morphology of the layer 5 of the third semiconductor using microscopy with resolution on the nanometer scale after epitaxial growth of the material. In the present embodiment, the growth temperature is quickly lowered to 300° C. under TBA and then to room temperature under $H_2$ after the growth of the InAs at 450° C. and then the sample is removed from the reactor of the MOCVD to observe the surface morphology using atomic force microscopy (AFM) for evidence of formation of wires rather than the formation of islands.

Figure 2:
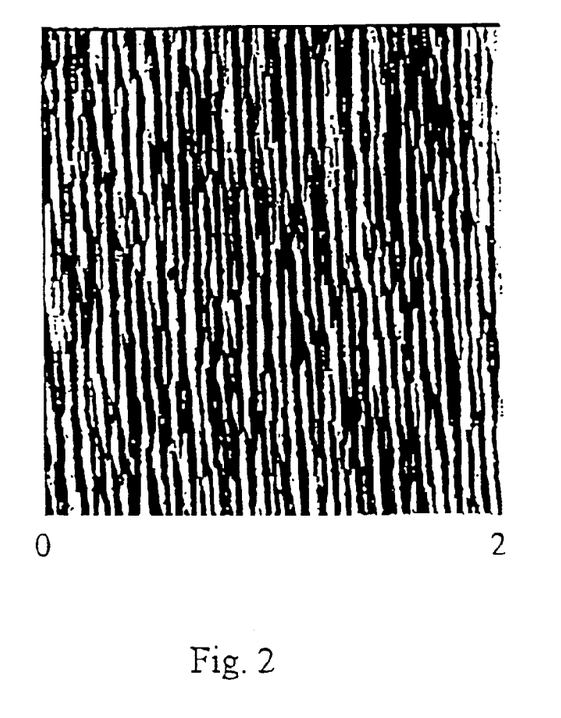
FIG. 2 is an atomic force microscope (AFM) image of the semiconductor surface, showing an InAs layer formed on the GaAs substrate by the method of FIGS. 1a–1c.

FIG. 2 shows the AFM image of the surface morphology of the InAs layer 5 grown on the surface of the GaAs layer 3 under the growth conditions stated above. It is clearly observed that the InAs wires 6 formed by the method embodying the invention are very uniform, the linear density of the wires being about 18 per micron with some of the wires being over 10000 Å in length. Most of the wires have a length above 100 nm, the width of the wires being less than 20 nm and the height of the wires being less than 2 nm. Generally, if the InAs layer is grown at higher temperatures, for example 510° C. or higher, with the other growth conditions being similar to those described above, in addition to the formation of wires, there will also be some islands which are randomly distributed on the surface. On the other hand, when the InAs layer is grown at a lower temperature, for example 410° C., wires are still formed on the surface of the InAs layer, even when the nominal thickness of the InAs layer reaches 6 monolayers. Furthermore, when the (001) GaAs substrate is inclined at 7 degrees towards the [110] direction, under the same growth conditions wires with a density of about 30 per micron are formed on the surface of the GaAs layer 3.

Figure 3:
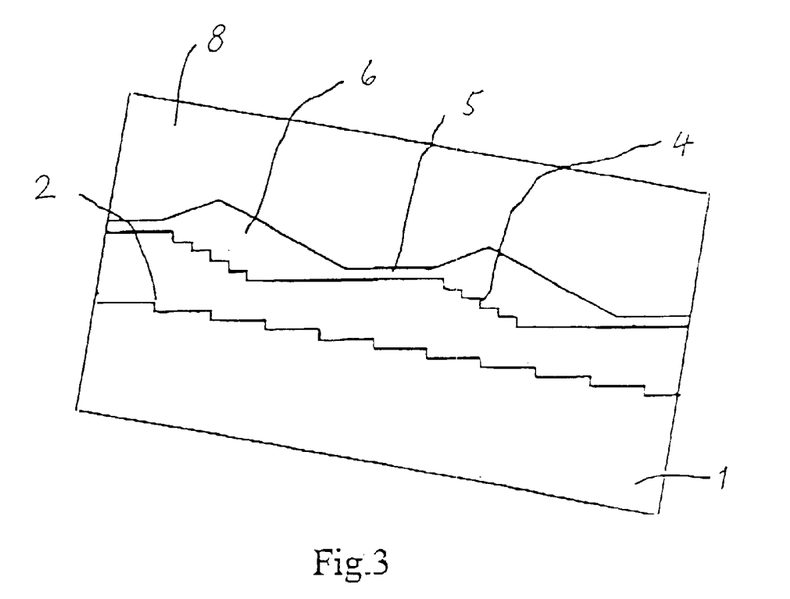
FIG. 3 is a cross-section view showing the quantum wires formed after the growth of a GaAs layer overlying the InAs layer.
Figure 5:
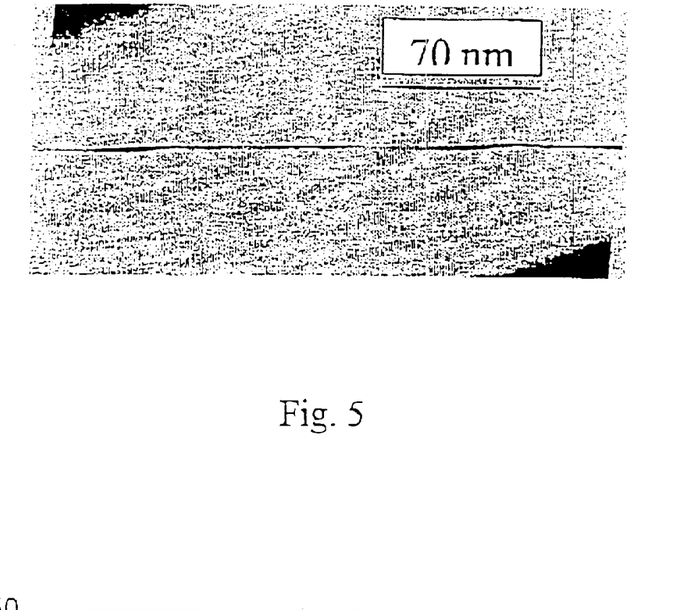
FIG. 5 is a cross-section view of a TEM image showing the self-organised quantum wires.

Referring to FIG. 3, after growth of the InAs layer 5 using predetermined growth conditions, a layer 8 of a fourth semiconductor, also GaAs in this case, is epitaxially grown to a thickness of 100 Å on the surface of the InAs layer 5 at the same temperature as the InAs layer was grown, to avoid changes in the InAs wire structures 6. The other growth conditions for the GaAs layer 8 are similar to those of the GaAs layer 3. The Ga.As layer 8 and the GaAs layer 3 together provide vertical and lateral confinement of charge carriers in the quantum wires 6 as shown in FIGS. 3 and 5.

Figure 6:
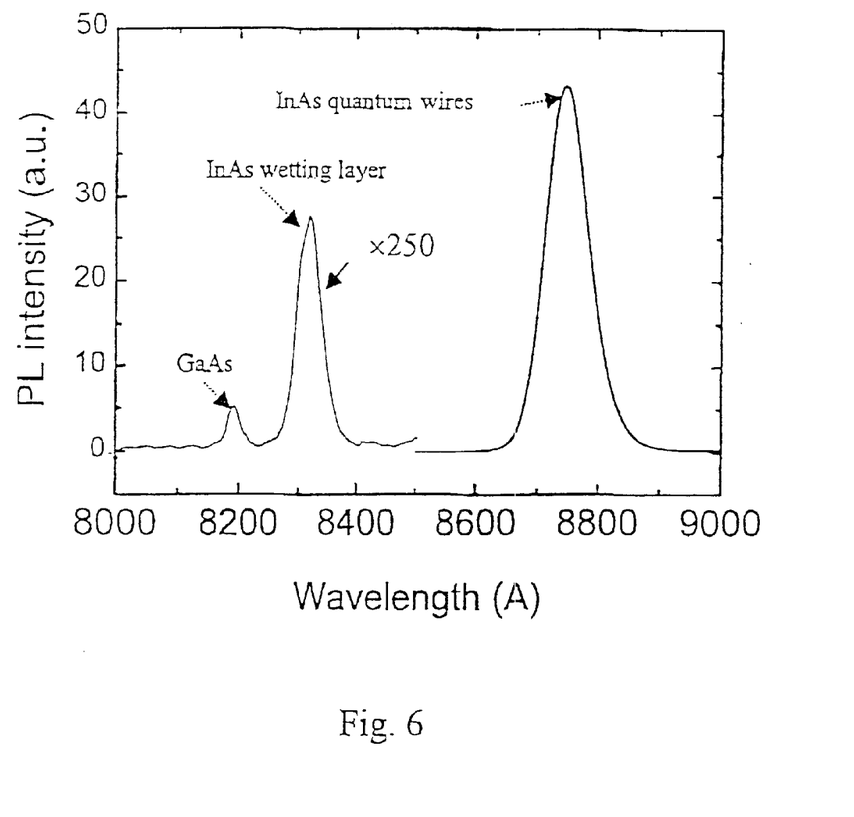
FIG. 6 is PL spectra emission from the InAs quantum wires embedded in GaAs.

The resulting quantum wires have unique opto-clectronic properties as illustrated by FIG. 6 which shows the photoluminescence spectra of a sample semiconductor structure fabricated by the described method embodying the invention. It can be clearly seen that the integrated intensity of the peak emission from the InAs quantum wires 6 is more than 1000 times higher than that from the GaAs material, and 100 times higher than that from the two-dimensional InAs layer 7 (called the "wetting layer" in FIG. 6), thereby demonstrating the very high quantum efficiency of the quantum wires. Moreover, the full width at half maximum of the photoluminescence emitted by the InAs quantum wires is less than 10 meV, indicating excellent uniformity of the self-organised quantum wires.

Figure 4:
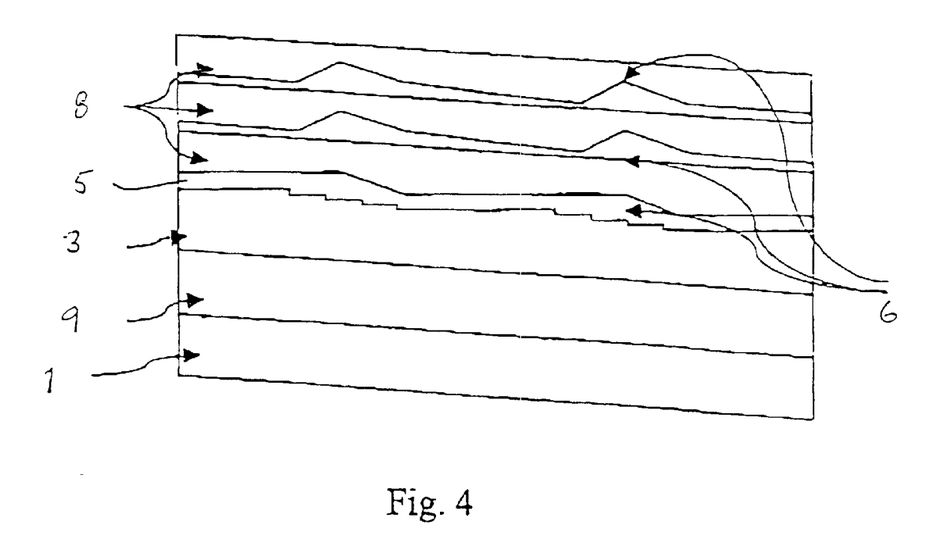
FIG. 4 is a cross-sectional view showing a structure with multiple layers of quantum wires formed by repeating the InAs layer formation and the growth of the overlying GaAs layer.

By repeating the deposition of the layers 5 and 8 of the third and fourth semiconductors on layer 3 of the second semiconductor, a vertically aligned multi-layer quantum wire array can be obtained as shown in FIG. 4, in which an optional cladding layer 9 on the substrate 1 is also shown.

A semiconductor structure including quantum wires produced by a method embodying the present invention is suitable for use in electronic or optoelectronic devices.

Figure 7:
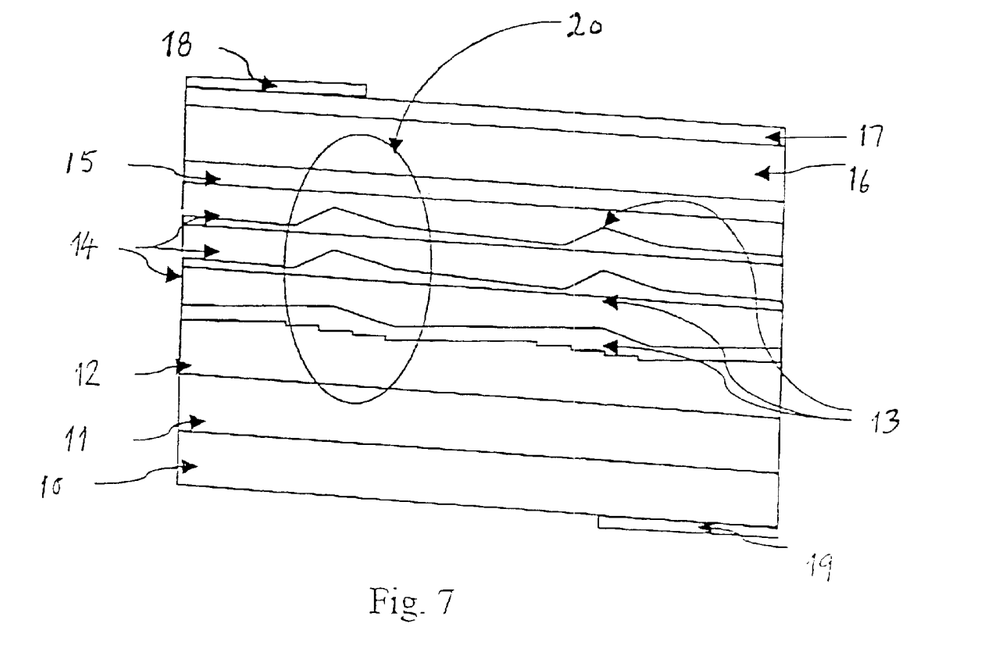
FIG. 7 is a cross-sectional view of an embodiment of an edge-emitting semiconductor laser structure embodying the present invention.

FIG. 7 shows a preferred embodiment of an optoelectronic semiconductor device embodying the invention in the form of an edge-emitting semiconductor laser structure in which the active layer comprises a multi-layer quantum wire array as illustrated in FIG. 4.

The fabrication of the exemplary device is carried out as follows: A 0.2 $\mu$m thick buffer layer of GaAs with silicon doping (n=~$2 \times 10^{18}$ cm$^{-3}$) is grown on a (001) Si-doped (n=~$2 \times 10^{18}$ cm$^{-3}$) GaAs substrate 10 inclined 2 degrees towards the (110) direction at a growth temperature of 650° C. by MOCVD technology and at a low pressure of 76 Torr. TMGa, TMAl, TMIn, and TBA are used as source materials and Pd-purified $H_2$ is used as the carrier gas. A first cladding layer 11 of $Al_{0.4}Ga_{0.6}As$ and 2 $\mu$m thickness and a first barrier layer 12 of GaAs with a thickness of 500 Å (FIG. 3b) are grown at the same temperature. The first cladding layer 11 is Si-doped with an electron concentration of ~$5 \times 10^{17}$ cm$^{-3}$. The growth temperature is then lowered to 480° C. for growth of the quantum wire layers 13 of 2 monolayers of InAs, and a barrier layer 14 of GaAs of 100 Å thickness. This pair of layers is repeated three times and is grown at a growth rate of 0.5 Å per second. After this, the growth temperature is increased to 650° C. and then the last barrier layer 15 of GaAs is grown to a thickness of 400 Å. The band gap of the barrier layers 12, 14 and 15 is larger than that of the quantum wires, so that the barrier layers provide quantum confinement. A Zn-doped second cladding layer 16 of $Al_{0.4}Ga_{0.6}As$ of 2 $\mu$m thickness with a hole concentration of ~$1 \times 10^{18}$ cm$^{-3}$ is grown and, in conjunction with the first cladding layer 11 forms a waveguide of the laser structure. A Zn-doped contact layer 17 of GaAs with a thickness of 0.2 $\mu$m and a hole concentration of about $1 \times 10^{19}$ cm$^{-3}$ is next grown.

Au—Zn alloy 18 is evaporated onto the top surface of the grown structure and an Au—Ge—Ni alloy 19 is evaporated onto the bottom surface of the substrate. The sample is then cleaved into chips which are 500 $\mu$m long and 200 $\mu$m wide to form a generic edge-emitting laser diode with cavity surfaces (not shown in FIG. 7).

Figure 8:
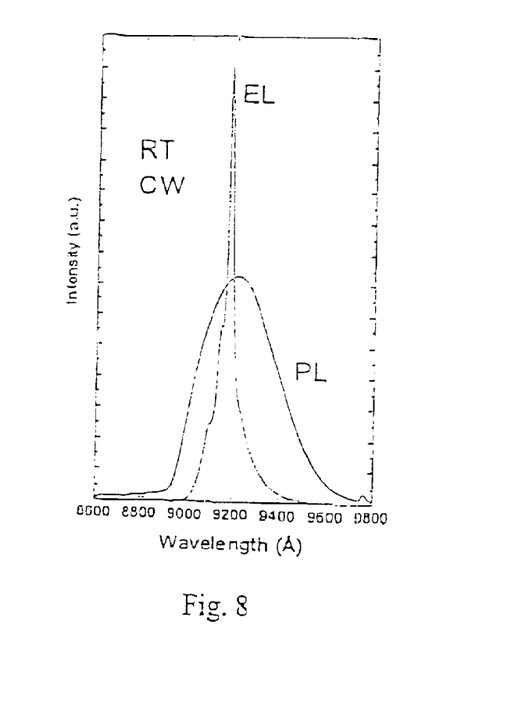
FIG. 8 shows the spectra of the quantum wire laser taken at room temperature and CW conditions and photoluminescence taken at room temperature.

The wavelength of the radiation emitted by the quantum wire laser described above is around 9200 Å at room temperature. Preliminary results show that the CW threshold intensity is less than 1 KA/cm. FIG. 8 shows the spectrum of the laser and its photoluminescence at room temperature.

The embodiments described above are illustrative of but a few of the many possible embodiments of the invention. Numerous and various other arrangements may be readily envisaged and devised in accordance with the principles of the invention by those skilled in the art.

In the present specification "comprise" means "includes or consists of" and "comprising" means "including or consisting of".

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

What is claimed is:

1. A method of fabricating a semiconductor structure having self-organized quantum wires, comprising:
    a) providing a substrate of a first semiconductor having single atomic steps on a vicinal surface thereof;
    b) forming a second semiconductor on the vicinal surface of the substrate, so that the surface of the second semiconductor presents multi-atomic steps;
    c) forming on the second semiconductor a third semiconductor, which has a greater lattice mismatch than the second semiconductor with the first semiconductor and which has a narrower band gap than the second semiconductor, to form quantum wires of the third semiconductor along the edges of the multi-atomic steps of the second semiconductor; and
    d) forming on the third semiconductor a fourth semiconductor with a band gap wider than the third semiconductor to bury the quantum wires in the second and fourth semiconductors.

2. The method of claim 1 wherein the vicinal surface of the substrate is a nominal (001) surface inclined at an angle to the [110] direction.

3. The method of claim 2 wherein the vicinal surface is inclined at an angle of less than ten degrees to the [110] direction.

4. The method of claim 1 wherein the second semiconductor has a lattice mismatch of less than 1.0% with the first semiconductor.

5. The method of claim 4 wherein the second semiconductor is the same as the first semiconductor.

6. The method of claim 1 wherein the fourth semiconductor is chosen to have a lattice mismatch of less than 1.0% with the first semiconductor.

7. The method of claim 6 wherein the fourth semiconductor is the same as the second semiconductor.

8. The method of claim 1 wherein the third semiconductor has a lattice mismatch of at least 2.5% with the first semiconductor.

9. The method of claim 1 wherein the first semiconductor is GaAs.

10. The method of claim 1 wherein the first semiconductor is InP.

11. The method of claim 1 wherein the second and fourth semiconductors are selected from the group consisting of compound semiconductors formed from group III and group V elements and compound semiconductors formed from group II and group VI elements.

12. The method of claim 1 wherein the third semiconductor is selected from the group consisting of binary and ternery compound semiconductors formed from group III and group V elements and binary and ternary compound semiconductors formed from group II and group VI elements.

13. The method of claim 1 wherein the second, third and fourth semiconductors are deposited by a growth technique selected from the group consisting of MOCVD, GSMBE, VPE, CBE and MBE.

14. The method of claim 1 wherein the third semiconductor is grown at a temperature in the range of 380 to 580° C.

15. The method of claim 1 where the growth rate of the third semiconductor is no more than 2 Å/s.

16. The method of claim 1 wherein the third semiconductor is grown to a thickness of from 0.3 to 3.0 nm.

17. The method of claim 1 comprising repeating steps c) and d) a desired number of times to form a plurality of layers of quantum wires.

18. A method of fabricating a semiconductor device comprising constructing an active layer of the device by forming at least one layer of quantum wires using the method of claim 1.

19. The method of claim 18 wherein the semiconductor device is a laser.

20. A semiconductor device comprising: a substrate of a first semiconductor having single atomic steps on a vicinal surface thereof; a layer of a second semiconductor deposited on the vicinal surface of the substrate and having multi-atomic steps on the surface thereof; a layer of a third semiconductor deposited on the second semiconductor, the third semiconductor having a greater lattice mismatch than the second semiconductor with the first semiconductor and having a narrower band gap than the second semiconductor, the layer of the third semiconductor forming quantum wires along the edges of the multi-atomic steps of the second semiconductor; and a layer of a fourth semiconductor deposited on the third semiconductor, the fourth semiconductor having a wider band gap than the third semiconductor and the quantum wires being buried in the second and fourth semiconductors.

21. A device according to claim 20 wherein the vicinal surface of the substrate is a nominal (001) surface inclined at an angle to the [110] direction.

22. A device according to claim 20 wherein the second semiconductor has a lattice mismatch of less than 1.0% with the first semiconductor.

23. A device according to claim 20 wherein the second semiconductor is the same as the first semiconductor.

24. A device according to claim 20 wherein the fourth semiconductor is chosen to have a lattice mismatch of less than 1.0% with the first semiconductor.

25. A device according to claim 20 wherein the third semiconductor has a lattice mismatch of at least 2.5% with the first semiconductor.

26. A device according to claim 20 comprising a succession of layers of the third and fourth semiconductors defining a plurality of layers of quantum wires.

27. A device according to claim 20 in the form of an edge-emitting semiconductor laser.

28. The method of claim 1 wherein the step of forming the second semiconductor on the vicinal surface of the substrate is performed by epitaxially depositing the second semiconductor on the vicinal surface of the substrate;

the step of forming the third semiconductor on the second semiconductor is performed by epitaxially depositing the third semiconductor on the second semiconductor; and the step of forming the fourth semiconductor on the third semiconductor is performed by epitaxially depositing the fourth semiconductor on the third semiconductor.

* * * * *